US010362707B2

(12) United States Patent
Chiasson et al.

(10) Patent No.: US 10,362,707 B2
(45) Date of Patent: Jul. 23, 2019

(54) REDUCED DEPTH DATA STORAGE ASSEMBLY AND RACK SERVER

(71) Applicant: DELL PRODUCTS, L.P., Round Rock, TX (US)

(72) Inventors: Shane Michael Chiasson, Austin, TX (US); James Frederic McKinney, Austin, TX (US); Alan Jacob Brumley, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/906,129

(22) Filed: Feb. 27, 2018

(65) Prior Publication Data
US 2018/0192536 A1 Jul. 5, 2018

Related U.S. Application Data

(62) Division of application No. 14/316,148, filed on Jun. 26, 2014, now Pat. No. 9,924,610.

(51) Int. Cl.
*H05K 7/14* (2006.01)
*G11B 33/12* (2006.01)

(52) U.S. Cl.
CPC ......... *H05K 7/1487* (2013.01); *G11B 33/124* (2013.01)

(58) Field of Classification Search
CPC .. H05K 7/1489; H05K 7/1487; H05K 7/1461; H05K 7/1424; H05K 7/1488; G06F 1/187; G06F 1/186; G11B 33/124
See application file for complete search history.

(56) References Cited

U.S. PATENT DOCUMENTS

| 5,546,273 | A  | 8/1996  | Harris           |
| 6,052,278 | A  | 4/2000  | Tanzer et al.    |
| 6,490,151 | B1 | 12/2002 | Nelson et al.    |
| 7,200,008 | B1 | 4/2007  | Bhugra           |
| 7,948,747 | B2 | 5/2011  | Ajo et al.       |
| 8,035,961 | B2 | 10/2011 | Figuerado et al. |
| 8,749,966 | B1 | 6/2014  | Boudreau et al.  |
| 8,811,020 | B2 | 8/2014  | Song et al.      |

(Continued)

OTHER PUBLICATIONS

PowerEdge R420 Technical Guide, May 2012, Rev. 1.0, p. 11, Fig. 4, http://partnerdirect.dell.com/sites/channel/Documents/PowerEdge-Rack-Server-R420-Technical-Guide-May2012.

Primary Examiner — Hoa C Nguyen
Assistant Examiner — Christopher L Augustin
(74) Attorney, Agent, or Firm — Isidore PLLC

(57) ABSTRACT

A method of making a reduced-depth rack server includes: forming a tray structure of a carrier having a service panel attached to two opposed side panels and a bottom panel; inserting a longest dimension of a data storage device in a sideways orientation with at least one electrical connector of the data storage device proximate to a selected lateral panel; electrically connecting a first electrical connector of an interposer cable to the at least one electrical connector of the data storage device; and attaching a second electrical connector attached to one of the tray structure and the data storage device directed towards an insertion end of the data storage assembly in an orientation opposite to the service panel and aligned to electrically connect with a backplane of a reduced-depth rack server in response to the tray structure being inserted in a rack server chassis.

11 Claims, 7 Drawing Sheets

(56) References Cited

U.S. PATENT DOCUMENTS

| | | |
|---|---|---|
| 8,976,530 B2 | 3/2015 | Jeffery et al. |
| 2006/0018087 A1 | 1/2006 | Mizuno et al. |
| 2009/0097375 A1 | 4/2009 | Uefune et al. |
| 2009/0273896 A1 | 11/2009 | Walker et al. |
| 2010/0254096 A1 | 10/2010 | Kim et al. |
| 2011/0134599 A1 | 6/2011 | Li |
| 2011/0194242 A1 | 8/2011 | Hu et al. |
| 2011/0255234 A1 | 10/2011 | Chen et al. |
| 2013/0058033 A1 | 3/2013 | Hu et al. |
| 2013/0107454 A1 | 5/2013 | Wilke et al. |
| 2014/0078664 A1 | 3/2014 | Lau et al. |
| 2014/0106595 A1* | 4/2014 | Zhu ................. H01R 13/62 439/345 |

\* cited by examiner

REDUCED DEPTH DATA STORAGE ASSEMBLY AND RACK SERVER

RELATED APPLICATION

This application is a divisional of U.S. patent application Ser. No. 14/316,148, filed Jun. 26, 2014, which is fully incorporated herein by reference.

BACKGROUND

1. Technical Field

This disclosure generally related to information handling systems, and more particular to a data storage assembly that is front or top loaded into a rack server.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Standardization of dimensions of rack servers fosters design and manufacturing economies for information technology (IT) components that are part of an IHS. Rack assemblies, such as those based on a nineteen (19) inch frame size in lateral width, have a lateral dimension defined to handle full-width server sleds containing IT gear for computing and/or storage. However, shallower depth rack server chassis may be required to accommodate situations where physical space is extremely constrained. Some examples include the military where servers are installed in vehicles. Another example is telecommunication applications where rack rooms can be extremely small. However, the functionality of a rack server tends to require a number of components that are difficult to fit into a single product. Thus, the end-to-end component stack up of PCIe (Peripheral Component Interconnect Express) adapters, memory, central processing unit (CPU), fans, backplane, and hard disk drive (HDD)/HDD carrier exceeds the allowable 20" in depth. Isolation/vibration damping requirements can increase a depth requirement, further complicating any efforts to reduce the depth of a rack server.

BRIEF SUMMARY

The illustrative embodiments of the present disclosure provide a data storage assembly for a reduced-depth rack server. In one embodiment, the data storage assembly includes a data storage device having a carrier and at least one electrical connector on a front end. The carrier includes a tray structure having a service panel attached to two opposed side panels and a bottom panel. The tray structure is sized to receive a longest dimension of the data storage device in a sideways orientation with the at least one electrical connector proximate to a selected lateral panel. An interposer cable has a first electrical connector electrically connected to the at least one electrical connector of the data storage device and has a second electrical connector attached to one of the tray structure and the data storage device directed towards an insertion end of the data storage assembly in an orientation opposite to the service panel. The second electrical connector electrically connects with a backplane of a reduced-depth rack server in response to the tray structure being inserted in a rack server chassis.

According to at least one aspect of the present disclosure, a reduced-depth rack server is provided for utilization within a reduced depth rack. In one embodiment, a data storage assembly of the reduced-depth rack server includes a carrier and a data storage device having at least one electrical connector on a front end. The carrier includes a tray structure having a service panel attached to two opposed side panels and a bottom panel. The tray structure is sized to receive the data storage device in a sideways orientation with the at least one electrical connector proximate to a selected lateral panel. An interposer cable has a first electrical connector electrically connected to the at least one electrical connector of the data storage device. A second electrical connector of the interposer cable is attached to one of the tray structure and the data storage device directed towards an insertion end of the data storage assembly in an orientation opposite to the service panel. The chassis of the reduced-depth rack server includes a side panel having a slot to receive the insertion end of the data storage assembly in the rack server chassis, and a backplane of a rack server to electrically connect with the second electrical connector of the interposer cable in response to the tray structure being inserted.

According to at least one aspect of the present disclosure, a method is provided for making a reduced depth rack server. In one embodiment, the method includes: forming a tray structure of a carrier having a service panel attached to two opposed side panels and a bottom panel; and inserting a longest dimension of a data storage device in a sideways orientation with at least one electrical connector of the data storage device proximate to a selected lateral panel. The method further includes electrically connecting a first electrical connector of an interposer cable to the at least one electrical connector of the data storage device. The method includes attaching a second electrical connector attached to one of the tray structure and the data storage device. The second electrical connector is directed towards an insertion end of the data storage assembly in an orientation opposite to the service panel. The second electrical connector is thus aligned to electrically connect with a backplane of a rack server in response to the tray structure being inserted in a rack server chassis.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
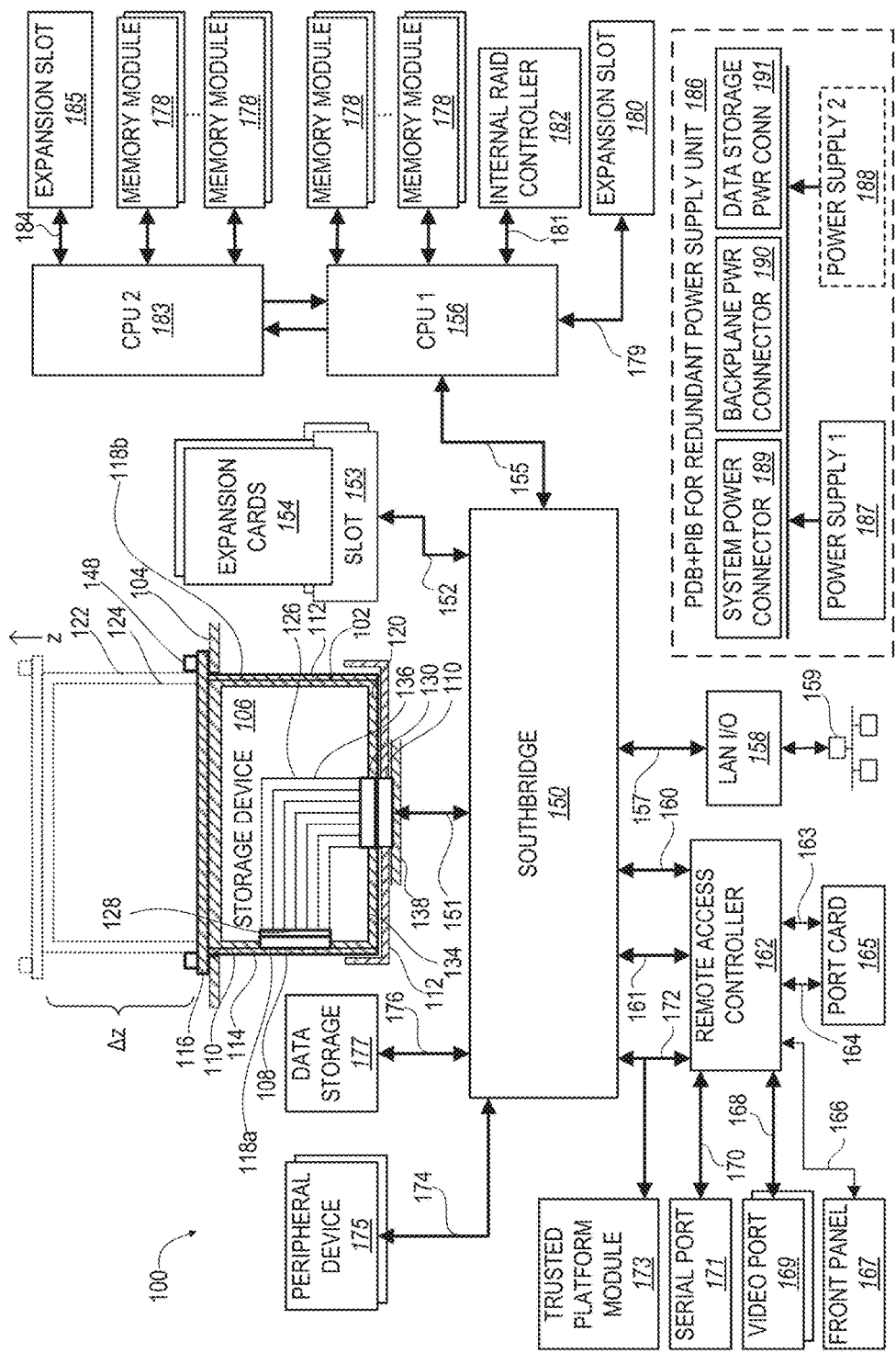
FIG. 1 illustrates a block diagram of an example reduced-depth rack server within which various aspects of the disclosure can be implemented, according to one or more embodiments.

The present innovation provides a reduced-depth rack server for a reduced depth rack that includes a data storage device rotated a quarter turn within a carrier to form a data storage assembly. The data storage device presents its longest dimension sideways in the carrier to form a data storage assembly with a reduced depth as measured along its axis of insertion into the reduced-depth rack server. An interposer cable, which is also part of the data storage assembly, has a first connector that connects to a laterally presented electrical connector of the data storage device. The interposer cable provides a second connector to an insertion end of the data storage assembly. The first and second connectors of the interposer cable are connected by an L-shaped cable, such as a folded, flat bus cable. The data storage assembly is inserted inwardly into a rack server chassis to electrically connect with a backplane of the reduced-depth rack server. In one embodiment, a data storage assembly is inserted from a front end of the rack server chassis. In one embodiment, the data storage assembly is inserted from a top of the chassis to facilitate airflow.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 illustrates a two-dimensional block diagram representation of an example reduced-depth rack server 100, within which one or more of the described features of the various embodiments of the disclosure can be implemented. A data storage assembly 102 has a reduced depth, thus allowing a corresponding reduction in depth of a rack server chassis 104. As a two-dimensional image, certain of the presented components are shown in different orientations relative to each other for simplicity in describing the connectivity of the components. For purposes of this disclosure, an information handling system (IHS), such as reduced-depth rack server 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an IHS may be a handheld device, personal computer, a server, a network storage device, or any other suitable device and may vary in size, shape, performance, functionality, and price. The IHS may include random access memory (RAM), one or more processing resources such as a central processing unit (CPU) or hardware or software control logic, read only memory (ROM), and/or other types of nonvolatile memory. Additional components of the IHS may include one or more disk drives, one or more network ports for communicating with external devices as well as various input and output (I/O) devices, such as a keyboard, a mouse, and a video display. The IHS may also include one or more buses operable to transmit communications between the various hardware components.

As presented in FIG. 1, reduced-depth rack server 100 includes a data storage device 106 having at least one electrical connector 108 on a front end 110 that typically is inserted first into the rack server chassis 104. For example, the data storage device 106 may be a hard disk drive (HDD) mounted within a carrier 112 that is received within the rack server chassis 104 of the reduced-depth rack server 100. To present a reduced depth, a longest dimension of the data storage device 106 is rotated a quarter turn (90°) within a carrier 112 to form a data storage assembly 102. The carrier 112 has a tray structure 114 including a service panel 116 attached to two opposed side panels 118a, 118b and a bottom panel 120. The tray structure 114 is sized to receive the data storage device 106 in a sideways orientation. In one embodiment, the side panels 118a, 118b are substantially parallel to each other. The at least one electrical connector 108 of the data storage device 106 is proximate to a selected lateral panel 118a. In an exemplary aspect, the carrier 112 maintains lateral dimension commonality with a longer carrier 122 of a larger size data storage device 124 (both shown in phantom) yet allows a rack server chassis 104 to have a reduced depth in a z-axis.

Figure 2:
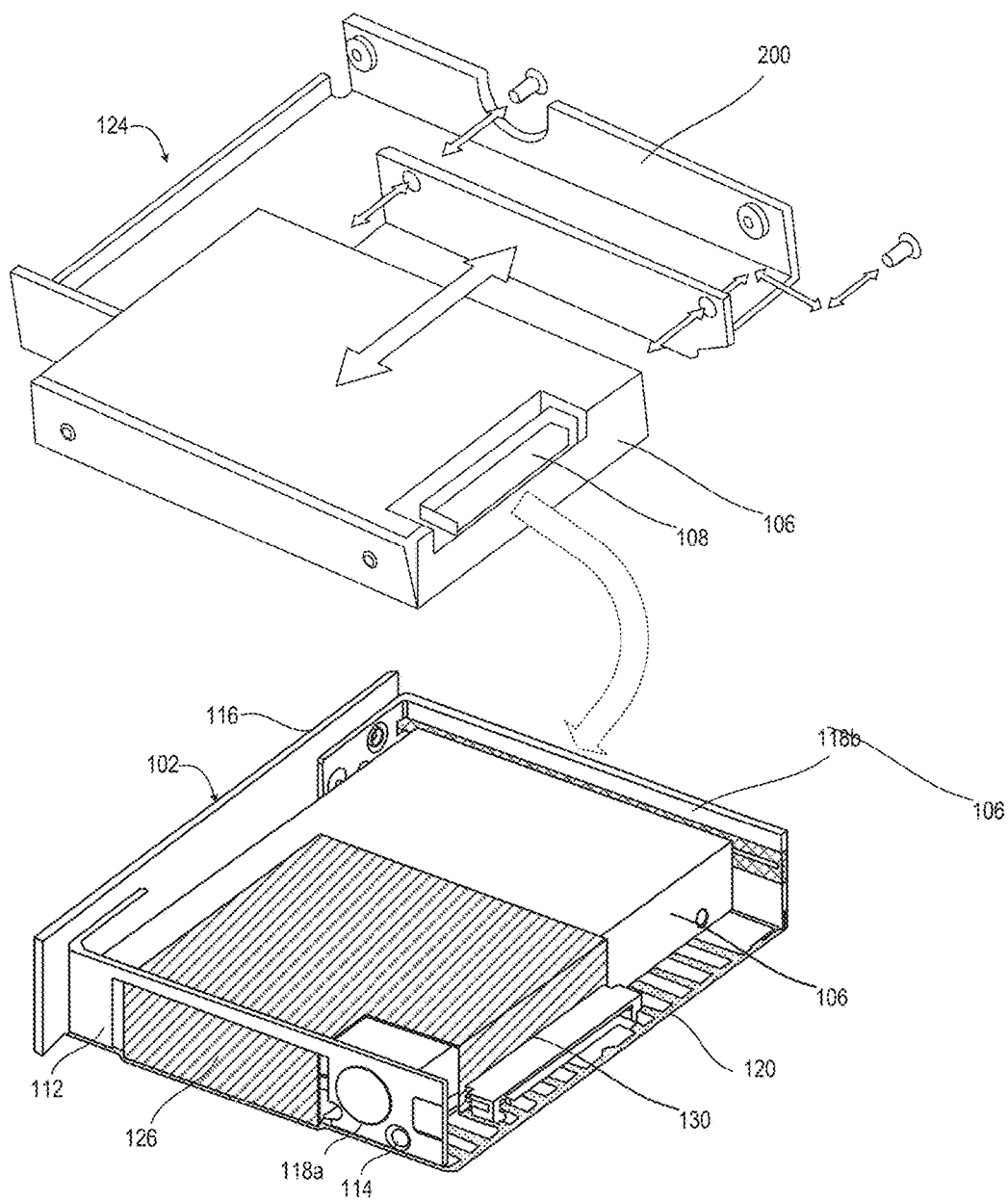
FIG. 2 illustrates an isometric view of sideways mounting a data storage device in a carrier to form a shortened data storage assembly for the reduced-depth rack server of FIG. 1, according to one embodiment.

In an exemplary implementation, the larger size data storage device 124 is a 3.5" HDD whose longest dimension is longitudinally oriented into the longer carrier 122, which thus may be referred to as a 3.5" carrier. Certain configurations of a generally-known rack server may use 2.5" HDDs with their longest dimension in a Z-axis or longitudinal orientation. The same envelope size as the 3.5" carrier may be used by introducing an adapter 200 (FIG. 2). By contrast, the present innovation discloses a sideways orientation of the data storage device 106, which may be a 2.5" HDD. The quarter turn given to the conventional orientation can reduce the depth of the carrier 112 and thus reduce the space allotted thereto in the chassis 104. A further reduction in depth in the Z-axis may be realized by selecting a smaller data storage device 106, such as going from a 3.5" HDD to 2.5" HDD to even a 1.8" HDD.

An interposer cable 126 of the data storage assembly 102 has a first electrical connector 128 electrically connected to the at least one electrical connector 108 of the data storage device 106, and the interposer cable 126 also has a second electrical connector 130 attached to one of the tray structure 114 and the data storage device 106 directed towards an insertion end 134 of the data storage assembly 102 in an orientation opposite to the service panel 116. In one embodiment, the interposer cable 126 includes a folded, L-shaped bus cable 136 that is electrically connected between the first and second electrical connectors 128, 130.

Figure 1A:
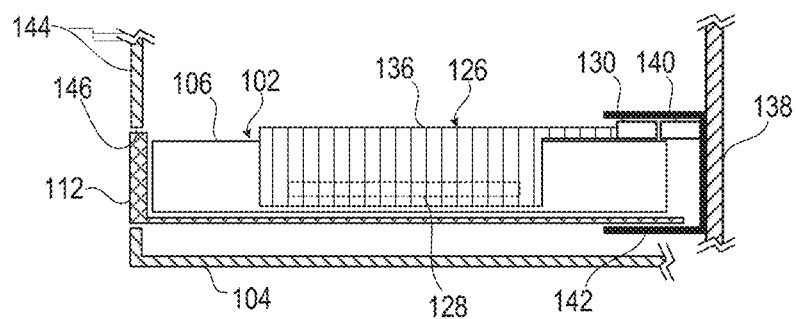
FIG. 1A illustrates a block diagram of a data storage assembly being connected to a backplane of the reduced-depth rack server of FIG. 1, according to one embodiment.

In FIGS. 1A and 2, the interposer cable 126 enables the sideways orientation of the data storage device 106 by interfacing to a backplane 138, in particular with a receiving mating connector 140 of a hot pluggable bay 142 attached to the backplane 138. The rack server chassis 104 has a front side panel 144 having a slot 146 (FIG. 1A) to receive the insertion end 134 of the data storage assembly 102 in the rack server chassis 104. The backplane 138 of the reduced-depth rack server 100 electrically connects with the second electrical connector 130 of the interposer cable 126 in response to the tray structure 114 being inserted. In one embodiment, the service panel 116 of the carrier 112 includes a screw mount 148. In addition, a screw mount 148 may be appropriate for a high vibration or movement environment.

Figure 1B:
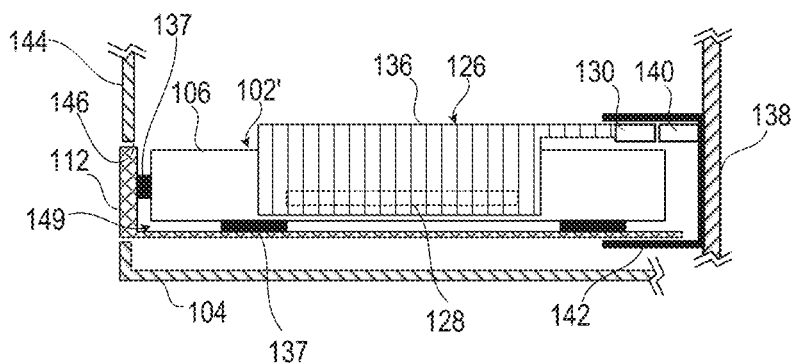
FIG. 1B illustrates a block diagram of a data storage assembly with seismic gaps for shock mounting being connected to a backplane of the reduced-depth rack server of FIG. 1, according to one embodiment.

FIG. 1B illustrates one embodiment of a data storage assembly 102' having a seismic gap 149 between the carrier 112 and the data storage device 106 is provided for shock mounting. The data storage device 106 is allowed to float by using a dampener material, such as rubber grommet 137, between the carrier 112 and the data storage device 106. For example, the rubber grommet 137 can be assembled on screw mounting points (not shown). The dampening material helps isolate the data storage device 106 from the shock that occurs to a rack server chassis 104 in which the data storage device 106 is installed. Thereby, the data storage device 106 is not exposed to the same magnitude of shock.

The present disclosure allows for a mechanical change to shorten the chassis 104 while leveraging commonality with certain aspects of larger HDD carrier designs for mounting points. In one embodiment, use of a folded cable instead of printed circuit board (PCB) allows leverage of Z-axis space with enhanced grommets for shock absorption. 'Stack over' of data storage device 106 with regard to the backplane connector stack further reduces depth. The approach allows "shock mount" of the HDD into the carrier such that the flex cable mates to the backplane, not the HDD. Thus the backplane does not absorb shock from the mass of the HDD but only from the flex cable plugged into the backplane. In addition, the 2.5" HDD carrier has a shorter Z-axis height than a 3.5" carrier which reduces the blockage in the front of the chassis for improved airflow or thermals.

With particular reference to FIG. 1, the data storage assembly 102 can communicate with any storage controller, such as via a PCIe connection. In an exemplary embodiment, the reduced-depth rack server 100 includes a southbridge 150 that communicates over a SATA (Serial Advanced Technology Attachment) in mini SAS (Serial-Attached SCSI (Small Computer System Interface)) connection 151 to the data storage assembly 102. The southbridge 150 may communicate over a PCIe connection 152 to expansion slots 153 that receive expansion cards 154. The southbridge 150 may communicate over a desktop management interface (DMI) connection 155 to a first CPU 156. The southbridge 150 may communicate over a PCIe Generation 2 connection 157 to a LAN input/output (I/O) 158, such as Ethernet, which in turn connects to a local access network (LAN) 159. The southbridge 150 may communicate over a PCIe Generation 2 connection 160 and a universal serial bus (USB) 161 to a remote access controller 162, which in turn communicates over a management medium access channel (MAC) 163 and an SD2 connection 164 to port card 165 and over an SPI (serial peripheral interface) bus 166 to a front panel 167. A storage device 106 could be connected to any storage controller capable of communicating through SATA or SAS protocols.

In one embodiment, the remote access controller 162 uses a networking protocol which provides out-of-band management facilities. The remote access controller 162 has its own processor, memory, network connection, and access to the system bus. Key features include power management, virtual media access and remote console capabilities, all available through a supported web browser or command line interface. This gives system administrators the ability to configure a machine as if they were sitting at the local console.

The southbridge 150 may communicate over a video connection 168 to front and rear video ports 169. The southbridge 150 may communicate over a Universal asynchronous receiver/transmitter (UART) connection 170 to a serial port 171. The southbridge 150 may communicate over a low pin count (LPC) bus 172 to both a trusted platform module 173 and the southbridge 150. The southbridge 150 may communicate over USB connections 174 to peripheral devices 175, both internal and external to include internal dual secure digital modules. The southbridge 150 may communicate over a SATA bus 176 to data storage devices 177 such as tape backup drives and optical drives.

Reduced-depth rack server 100 also includes CPUs, memory modules, and other functional components, as illustrated. First CPU 156 may communicate with memory modules 178, such as dual inline memory modules (DIMMs). The first CPU 156 may communicate over PCIe Generation 3 connections 179 to expansion slot 180. The first CPU 156 may communicate over PCIe Generation 3 connections 181 to an internal redundant array of independent disks (RAID) controller 182. A second CPU 183 that communicates over quick path interconnect (QPI) with the first CPU 156 may also communicate with memory modules 178 and over a PCIe Generation 3 connection 184 to expansion slot 185.

A power supply unit (PSU) 186 for the reduced-depth rack server 100 may include power distribution board and power interface board functions sourced from a first power supply 187 and optionally a second power supply 188. Power can be supplied to discrete components via a system power connector 189, a backplane power connector 190, and a data storage power connector 191.

FIG. 2 illustrates a generally-known data storage assembly 102 of a data storage device 106 having dimensions of a 2.5" HDD mountable to an adapter 200 for a 3.5" hot pluggable bay 142 (FIG. 1). To present a reduced depth, a longest dimension of the data storage device 106 is rotated 90° for mounting in the carrier 112 to form a data storage assembly 102. The carrier 112 can be a tray structure 114 including a service panel 116 attached to two opposed side panels 118a, 118b and a bottom panel 120. The carrier 112 is sized to receive the data storage device 106 in a sideways orientation. Unlike the generally-known adapter 200, the carrier 112 does not include an empty portion that is unoccupied by the data storage device 106.

In one embodiment, the second electrical connector 130 is a Serial Attached Small Computer System Interface (SAS) connector of less than 8 mm stack height to further reduce the depth of the data storage assembly 102. An L-shaped bus cable 136 of the interposer cable comprises a flexible cable having a printed circuit board (PCB) of less than 0.5-0.6 mm thickness.

Figure 3:
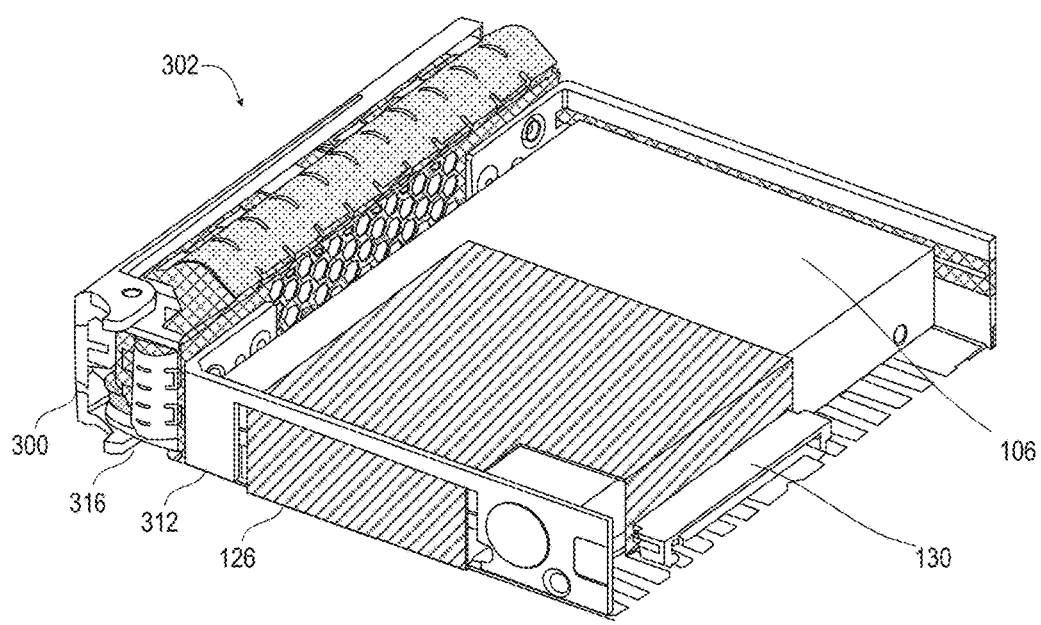
FIG. 3 illustrates an alternative design of a data storage assembly having a carrier that includes a cam lever, according to one embodiment.

FIG. 3 illustrates a data storage assembly 302 including a carrier 312 having a cam lever 300 incorporated into a service panel 316 for selectively engaging a rack server chassis 104 (FIG. 1). Hard drive performance can be affected by rotational vibration of system components. To help manage degradation of hard drive performance, hot plug carrier precedent is to reliably mate installed hard drive carriers to a chassis hard stop feature using a compressive load. In certain implementations, servicing of the data storage assembly 302 is expedited as compared to a screw mounting, which may be preferred in implementations less subject to movement.

In one embodiment, the second electrical connector 130 extends from the data storage device 106 and thus constrains the amount of reduction in depth that may be achieved. Generally-known SAS connectors that may serve as the second electrical connector 130 are 8 mm in height. The present disclosure contemplates that a 8 mm height SAS connector may be reconfigured to be 6 mm in height, allowing a reduction in the depth of the carrier 312. A bracket of plastic or metal can span across the carrier 312 and over the data storage device 106 while holding the second electrical connector 130 in the correct location for mating properly with the backplane 138 (FIG. 1).

Figure 4:
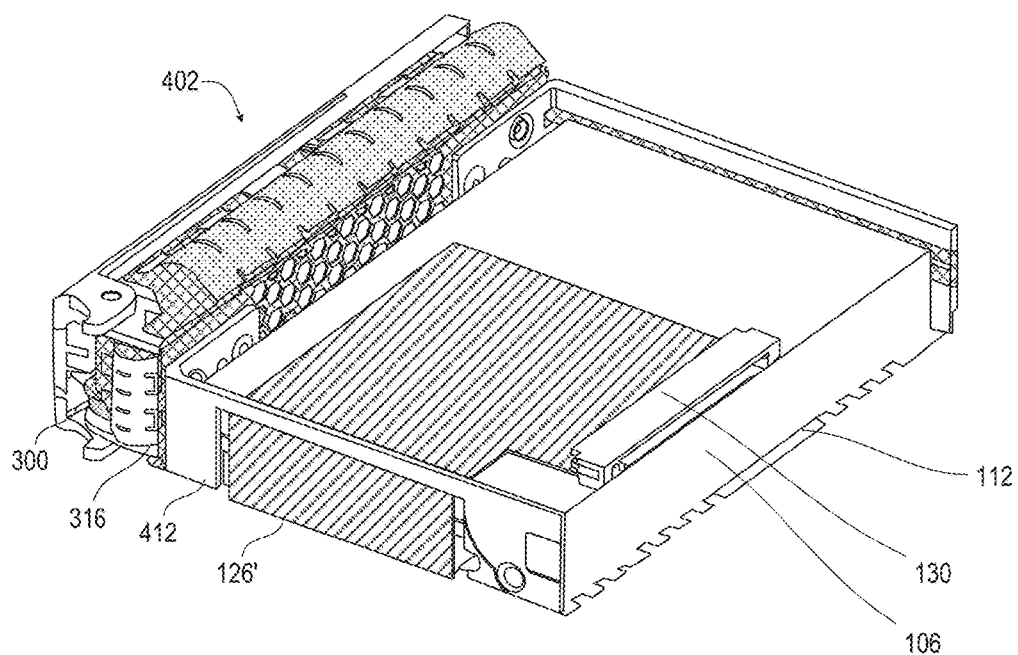
FIG. 4 illustrates the alternative design of a data storage assembly of FIG. 3 including an interposer cable having an overlaid connector, according to one embodiment.

FIG. 4 illustrates the storage assembly 402 with an alternate approach to reducing the height of the second electrical connector 130. In one embodiment, at least a portion of the second electrical connector 130 horizontally overlays one of a top and a bottom surface of the data storage device 106 to further reduce the depth of the data storage assembly 402. Thus, a carrier 412 can be further reduced in depth by not extending beyond the first inserted portion of the data storage device 106. An L-shaped interposer cable 126' is dimensioned for the changed placement of the second electrical connector 130.

Figure 5:
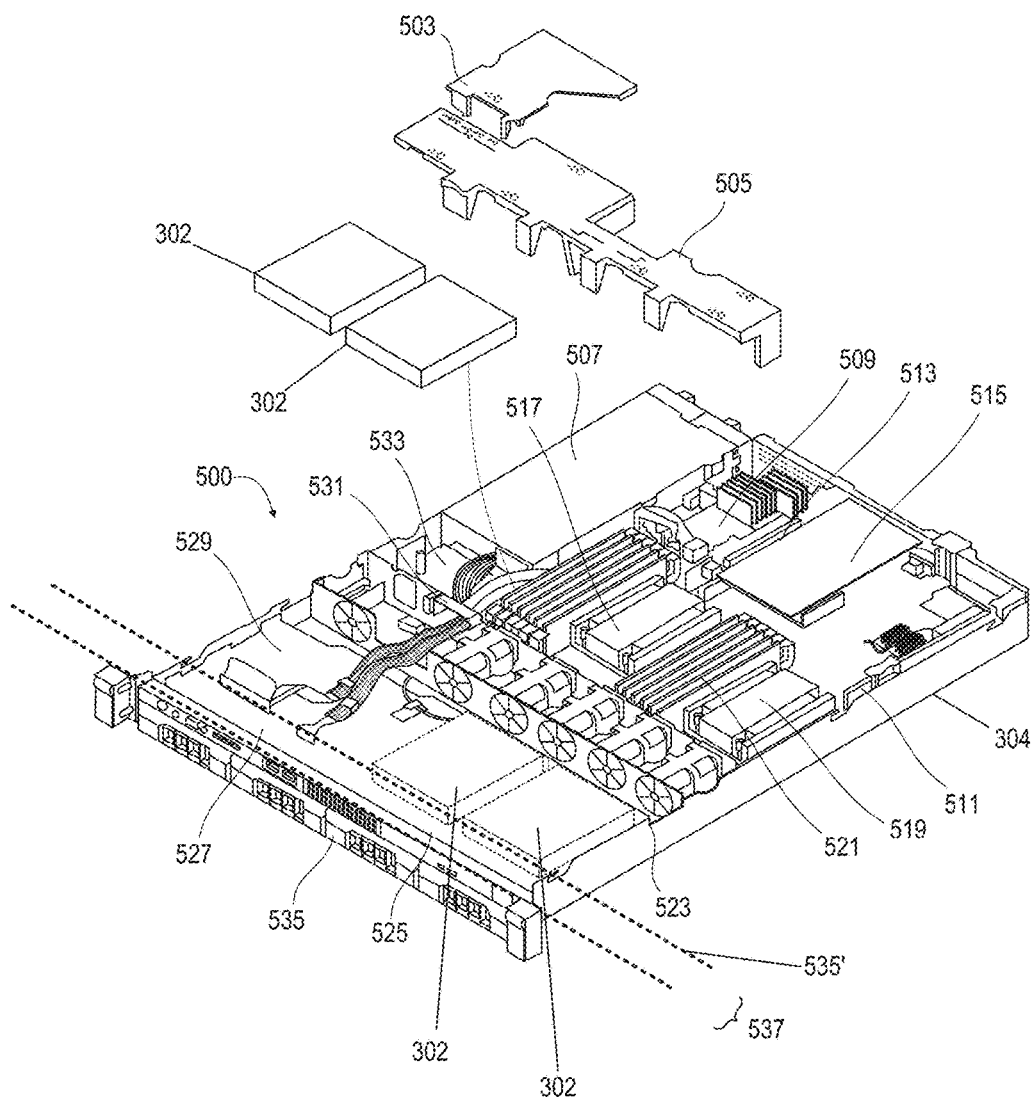
FIG. 5 illustrates an isometric view of an example reduced-depth rack server, according to one embodiment.

FIG. 5 illustrates an example reduced-depth rack server 500 that can be reduced in depth by utilizing the data storage assembly 302. A rack server chassis 304 is one rack unit (1U) wide in order to be generally compatible with rack-based IHSs. In one embodiment, the reduced-depth rack server 500 includes a power distribution board shroud 503, a cooling shroud 505, power supply units 507, storage controller card 509, a first expansion card riser 511, a second expansion card riser 513, an expansion card 515, a heat sink 517 for a first processor, a heat sink 519 for a second processor, twelve (12) dual inline memory modules (DIMM) 521, five (5) cooling fans 523, an optical drive 525, a control panel 527, a hard-drive backplane 529, cable routing latch 531, and a power distribution board 533. A front side 535 of the rack server chassis 304 can be moved back in depth by an amount 537 to a reduced front side 535' due to the reduced depth of the data storage assembly 302.

In an exemplary embodiment, the reduced-depth rack server 500 has four (4) 3.5" HDDs that are hot pluggable from the front side 535 of the rack server chassis 304. The width of a 3.5" HDD is sufficient to hold a 2.5" HDD that is rotated by 90 degrees. By rotating the 2.5" HDD 90 degrees, the rack server chassis 304 can be shortened by over 4", allowing the rack server chassis 304 to fit into a 20" depth military specification and telecommunication requirement. In one embodiment, even smaller HDDs may be used. For example, a 1.8" HDD in a sideways orientation would enable use of a correspondingly depth-reduced carrier and chassis. By virtue thereof, the reduced-depth rack server 500 can achieve a 17" chassis depth.

In an illustrative implementation, chassis depth is measured from rear chassis wall to the back of the rack ear. The starting point generally-known rack server is 23.81" (606.994 mm). An amount of 3.7" of depth is removed by rotating the 2.5" HDD sideways and by shortening the rack server chassis 304 to the depth required for the sideways 2.5" HDD. Recessing the SAS connector underneath the 2.5" HDD buys another 0.35" depth in the chassis length. For further depth reduction, it is noted that cam levers can be removed allowing encroachment on 0.750" of depth otherwise occupied thereby.

Figure 6:
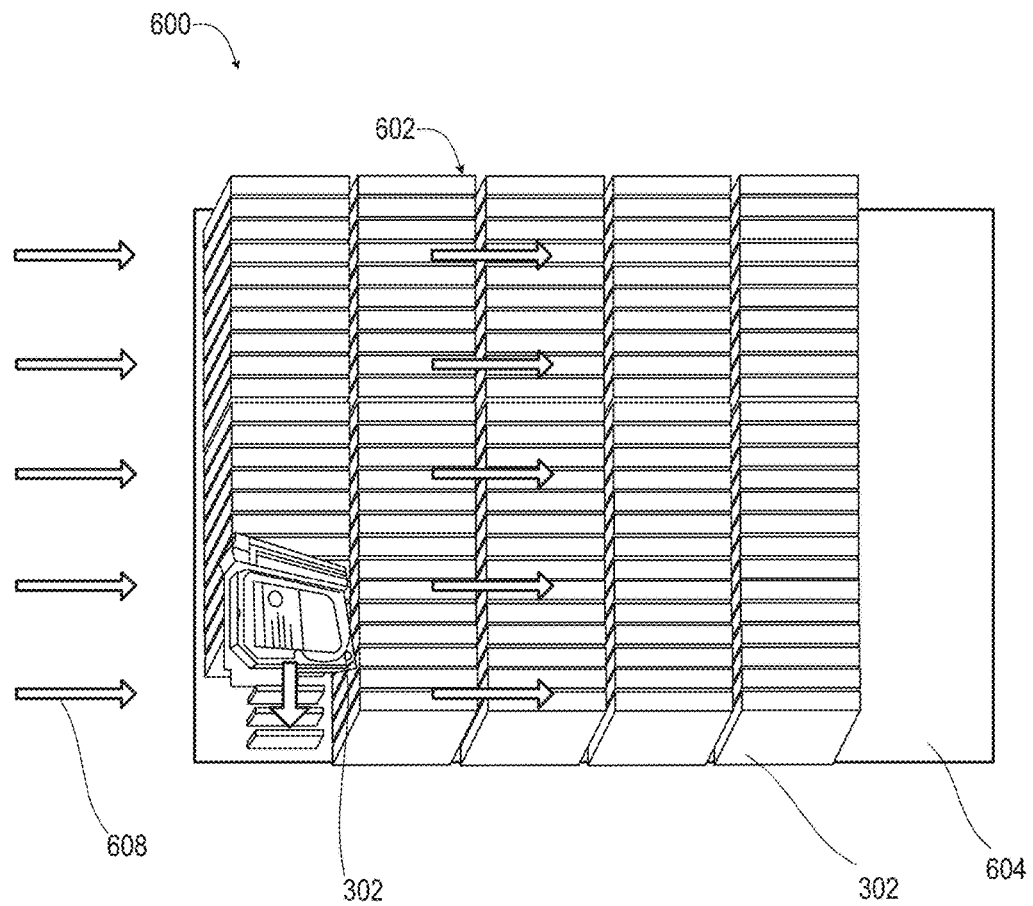
FIG. 6 illustrates an isometric view of an example top loaded chassis containing a Just a Bunch of Disk (JBOD) arrangement of data storage assemblies.

FIG. 6 illustrates a top-loaded chassis 600 that receives the data storage assembly 302 for a Just a Bunch of Disk (JBOD) implementation 602. A single 'planar' style backplane 604 that the data storage assemblies 302 connect to when installed from the top eliminates the need for individual backplanes, which reduces bill of material (BOM) costs and significantly improves airflow 608 over a backplane orientation that extends into the space.

Storage solutions are becoming increasingly more important as "the cloud" and customer data requirements continue to grow. System HDD density is becoming a big challenge for system architects and engineers and is currently constrained by HDD carrier implementation. Hard drive carriers limited to front and rear system access limit the number of hot swap drives that can be included in the system. Inserting hot swap drives from the top of a top-loaded chassis 600 chassis overcomes this limitation, creating an opportunity for higher density storage arrays. In particular, all of the interior of the top-loaded chassis 600 can be made accessible. Since the smaller dimension of the data storage assemblies 302 is presented vertically, the top-loaded chassis 600 can remain within a standard two rack unit (2U) height.

Figure 7:
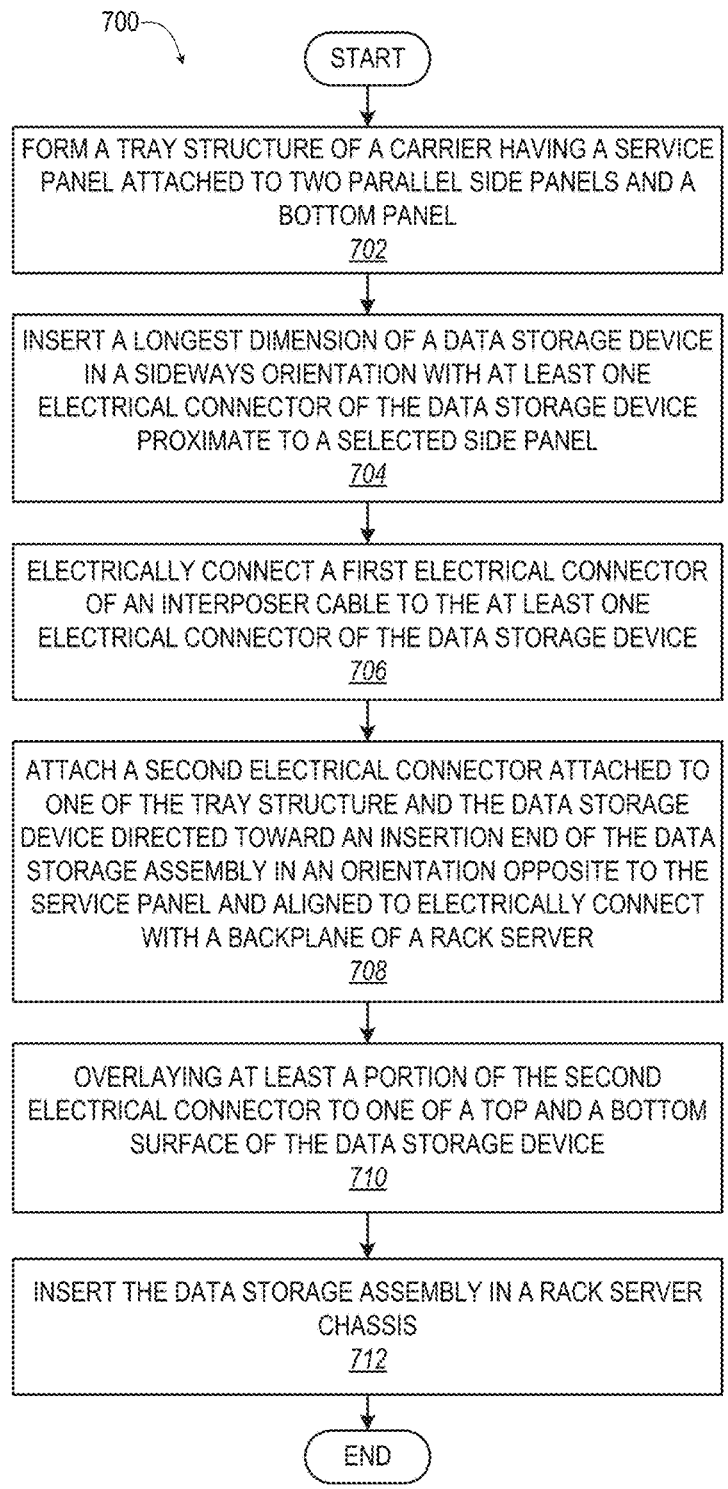
FIG. 7 illustrates a flow diagram of a method for reducing the depth of a reduced-depth rack server, according to one embodiment.

FIG. 7 illustrates a method 700 for making a rack server having a reduced depth. In one embodiment, the method includes forming a tray structure of a carrier having a service panel attached to two opposed side panels and a bottom panel (block 702). The method 700 includes inserting a longest dimension of a data storage device in a sideways orientation with at least one electrical connector of the data storage device proximate to a selected lateral panel (block 704). The method 700 includes electrically connecting a first electrical connector of an interposer cable to the at least one electrical connector of the data storage device (block 706). The method 700 includes attaching a second electrical connector attached to one of the tray structure and the data storage device directed towards an insertion end of the data storage assembly, in an orientation opposite to the service panel and aligned to electrically connect with a backplane of a reduced-depth rack server (block 708).

In one embodiment, attaching the second electrical connector further includes overlaying at least a portion of the second electrical connector to one of a top and a bottom surface of the data storage device (block 710). The method 700 includes inserting the data storage assembly in a rack server chassis (block 712).

In one embodiment, the method 700 further includes: providing the second electrical connector as a serial attached small computer system interface (SAS) connector of less than 8 mm stack height; providing the interposer cable including a flexible cable having a printed circuit board (PCB) of less than 0.06 mm thickness; providing the service panel of the carrier having a screw mount; and providing the data storage device comprising a 2.5 inch hard disk drive.

In one embodiment, the method 700 further includes: providing a side panel having a slot to receive the insertion end of the data storage assembly in the rack server chassis; attaching a backplane to the rack server chassis of the reduced-depth rack server; and inserting the tray structure to electrically connect the second electrical connector of the interposer cable to the backplane. In a particular embodiment, the method 700 includes: providing the side panel as a front side panel; and providing a hot pluggable bay of the backplane to receive the insertion end of the data storage assembly.

In one embodiment, the method 700 includes: providing the side panel as a top side panel; providing a hot pluggable bay of the backplane oriented to receive the data storage assembly aligned with airflow from front to back of the reduced-depth rack server; and attaching the backplane in parallel alignment to a bottom side panel of the rack server chassis.

In the above described flow chart of FIG. 7, one or more of the methods may be embodied in an automated manufacturing system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method of making a reduced-depth rack server, the method comprising:
    forming a tray structure of a carrier having a service panel attached to two opposed side panels and a bottom panel, the tray structure sized to receive a data storage device in a sideways orientation;
    inserting a longest dimension of a data storage device in the sideways orientation in the tray structure, with at least one electrical connector of the inserted data storage device placed proximate to a selected side panel of the two opposed side panels;
    electrically connecting, at the selected side panel, a first electrical connector of an interposer cable to the at least one electrical connector of the data storage device; and
    attaching a second electrical connector of the interposer cable to one of the tray structure and the data storage device, the second electrical connector directed towards an insertion end of the data storage assembly in an orientation opposite to the service panel and aligned to electrically connect with a backplane of a reduced-depth rack server in response to the tray structure being inserted in a rack server chassis.

2. The method of claim 1, wherein attaching the second electrical connector further comprises overlaying at least a portion of the second electrical connector to one of a top and a bottom surface of the data storage device.

3. The method of claim 1, further comprising:
    attaching a backplane to the rack server chassis a reduced-depth rack server; and
    inserting the tray structure to electrically connect the second electrical connector of the interposer cable to the backplane.

4. The method of claim 3, further comprises providing a hot pluggable bay of the backplane to receive the insertion end of the data storage assembly.

5. An information handling system comprising a reduced-depth rack server for a reduced depth rack, made according to the method of claim 1, the reduced-depth rack server comprising a rack server chassis that contains a backplane and including:
    a data storage assembly comprising:
        a data storage device having at least one electrical connector on a front end; and
        a carrier comprising:
            a tray structure having a service panel attached to two opposed side panels and a bottom panel, the tray structure sized to receive the data storage device in a sideways orientation, with the front end having the at least one electrical connector being inserted sideways relative to an orientation of a backplane of a chassis of the reduced-depth rack server in which the carrier is inserted, with the at least one electrical connector proximate to a selected lateral panel and not directed towards an insertion end of the data storage assembly; and
            an interposer cable having a first electrical connector electrically connected to the at least one electrical connector of the data storage device and having a second electrical connector attached to one of the tray structure and a side of the data storage device directed towards an insertion end of the data storage assembly in an orientation opposite to the an entry to service panel to electrically connect with the backplane of the reduced-depth rack server in response to the tray structure being inserted.

6. The information handling system of claim 5, wherein at least a portion of the second electrical connector of overlays one of a top and a bottom surface of the data storage device.

7. The information handling system of claim 5, wherein the second electrical connector comprises a Serial Attached Small Computer System Interface (SAS) connector of less than 8 mm stack height.

8. The information handling system of claim 5, wherein the interposer cable comprises a flexible cable having a printed circuit board (PCB) of less than 0.06 mm thickness.

9. The information handling system of claim 5, wherein the service panel of the carrier comprises a screw mount.

10. The information handling system of claim 5, wherein the data storage device comprises a 2.5 inch hard disk drive.

11. The information handling system of claim 5, wherein the backplane comprises a hot pluggable bay to receive the insertion end of the data storage assembly.

* * * * *